United States Patent
Ko

(10) Patent No.: US 9,461,117 B2
(45) Date of Patent: Oct. 4, 2016

(54) HIGH VOLTAGE SEMICONDUCTOR DEVICE AND METHOD OF MANUFACTURING THE SAME

(71) Applicant: DONGBU HITEK CO., LTD., Gangnam-gu Seoul (KR)

(72) Inventor: Choul Joo Ko, Sungnam-si (KR)

(73) Assignee: DONGBU HITEK CO., LTD., Gangnam-Gu, Seoul (KR)

( * ) Notice: Subject to any disclaimer, the term of this patent is extended or adjusted under 35 U.S.C. 154(b) by 0 days.

(21) Appl. No.: 14/696,794

(22) Filed: Apr. 27, 2015

(65) Prior Publication Data

US 2016/0087039 A1    Mar. 24, 2016

(30) Foreign Application Priority Data

Sep. 24, 2014  (KR) ........................ 10-2014-0127652

(51) Int. Cl.

| H01L 29/76 | (2006.01) |
| --- | --- |
| H01L 29/94 | (2006.01) |
| H01L 31/062 | (2012.01) |
| H01L 31/113 | (2006.01) |
| H01L 31/119 | (2006.01) |
| H01L 21/336 | (2006.01) |
| H01L 29/08 | (2006.01) |
| H01L 29/78 | (2006.01) |
| H01L 29/10 | (2006.01) |
| H01L 29/66 | (2006.01) |
| H01L 29/06 | (2006.01) |
| H01L 29/423 | (2006.01) |

(52) U.S. Cl.
CPC ........ *H01L 29/0878* (2013.01); *H01L 29/063* (2013.01); *H01L 29/1083* (2013.01); *H01L 29/66681* (2013.01); *H01L 29/66689* (2013.01); *H01L 29/7816* (2013.01); *H01L 29/086* (2013.01); *H01L 29/42368* (2013.01)

(58) Field of Classification Search
CPC ................... H01L 29/1083; H01L 29/66681; H01L 29/0878; H01L 29/7816
USPC .......................................... 257/339; 438/286
See application file for complete search history.

(56) References Cited

U.S. PATENT DOCUMENTS

| 8,389,341 B2 * | 3/2013 | Huang | .................. H01L 29/063 257/343 |
| --- | --- | --- | --- |
| 9,082,841 B1 * | 7/2015 | Chang | ..................... H01L 29/78 |
| 9,171,916 B1 * | 10/2015 | Snyder | ............. H01L 21/82385 |

FOREIGN PATENT DOCUMENTS

| KR | 1020100056101 | 5/2010 |
| --- | --- | --- |

OTHER PUBLICATIONS

Stanley Wolf, Silicon Processing for the VSLI ERA, 1990, Lattice Press vol. 2, pp. 23-24.*

* cited by examiner

*Primary Examiner* — David S Blum
(74) *Attorney, Agent, or Firm* — Patterson Thuente Pedersen, P.A.

(57) ABSTRACT

A high voltage semiconductor device includes a well region of a first conductive type formed at a surface portion of a substrate, a gate electrode disposed on the well region, a source region formed at a surface portion of the well region adjacent to the gate electrode, a drain region formed at a surface portion of the well region adjacent to the gate electrode, and a drift region of a second conductive type disposed under the drain region.

17 Claims, 4 Drawing Sheets

HIGH VOLTAGE SEMICONDUCTOR DEVICE AND METHOD OF MANUFACTURING THE SAME

CROSS-REFERENCE TO RELATED APPLICATION

This application claims priority to Korean Patent Application No. 10-2014-0127652, filed on Sep. 24, 2014, and all the benefits accruing therefrom under 35 U.S.C. §119, the contents of which are incorporated by reference in their entirety.

TECHNICAL FIELD

This disclosure is generally directed to semiconductor devices having means to control or prevent sub-surface currents, or with non-uniform channel doping. In embodiments, the claimed invention may be accomplished by positioning one or more drift regions at the base of a drain region, and positioning one or more impurity regions with varying dopant levels at a lateral surface of the device at a source region.

BACKGROUND

The present disclosure relates to a high voltage semiconductor device and a method of manufacturing the same, and more particularly, to a high voltage semiconductor device such as a lateral double diffused metal oxide semiconductor (LDMOS) device and a method of manufacturing the same.

A MOS Field Effect Transistor (MOSFET) may have relatively high input impedance compared to a bipolar transistor, providing a relatively large power gain and/or a relatively simple gate driving circuit. Further, the MOSFET may be a unipolar device having substantially no-time delay which may result from minority carrier storage and/or recombination while being turned off. The MOSFET may be applied to switching mode power supply devices, lamp ballasts, motor-driving circuits and the like. For example, a DMOSFET (Double Diffused MOSFET) manufactured by using a planar diffusion technology is generally used.

An LDMOS device may be applied to a VLSI process due to its relatively simple structure. For example, the LDMOS device may include an n-type RESURF (reduced surface field) region, a p-type first impurity region and an n-type second impurity region, which are formed under a gate electrode, so as to improve breakdown voltage and reduce on-resistance (Rsp).

SUMMARY

The present disclosure provides a high voltage semiconductor device having a reduced on-resistance and an improved breakdown voltage and a method of manufacturing the same.

In accordance with an aspect of the claimed invention, a high voltage semiconductor device may include a well region of a first conductive type formed at a surface portion of a substrate, a gate electrode disposed on the well region, a source region formed at a surface portion of the well region adjacent to the gate electrode, a drain region formed at a surface portion of the well region adjacent to the gate electrode, and a drift region of a second conductive type disposed under the drain region.

In accordance with some exemplary embodiments, the substrate may have a second conductive type.

In accordance with some exemplary embodiments, the drift region may be disposed in the well region.

In accordance with some exemplary embodiments, the drain region may include a second drift region of a first conductive type disposed on the drift region, a second well region of a first conductive type disposed on the second drift region, and a first impurity region of a first conductive type disposed on the second well region.

In accordance with some exemplary embodiments, the second well region may surround the first impurity region, and the second drift region may surround the second well region.

In accordance with some exemplary embodiments, the second drift region may have an impurity concentration higher than that of the well region, the second well region may have an impurity concentration higher than that of the second drift region, and the first impurity region may have an impurity concentration higher than that of the second well region.

In accordance with some exemplary embodiments, the source region may include a second impurity region of a first conductive type formed at the surface portion of the well region and a third well region of a second conductive type surrounding the second impurity region.

In accordance with some exemplary embodiments, the source region may further include a third impurity region disposed at one side of the second impurity region. The third impurity region may have a first conductive type and an impurity concentration lower than that of the second impurity region.

In accordance with some exemplary embodiments, the source region may further include a fourth impurity region disposed at another side of the second impurity region. The fourth impurity region may have a second conductive type and an impurity concentration higher than that of the third well region.

In accordance with some exemplary embodiments, the high voltage semiconductor device may further include a gate field plate disposed between the gate electrode and the drain region.

In accordance with another aspect of the claimed invention, a method of manufacturing a high voltage semiconductor device may include forming a well region of a first conductive type at a surface portion of a substrate, forming a drift region of a second conductive type in the well region, forming a drain region on the drift region, forming a source region to be spaced from the drain region, and forming a gate electrode on the well region.

In accordance with some exemplary embodiments, the forming the drain region may include forming a second drift region of a first conductive type on the drift region, forming a second well region of a first conductive type in the second drift region, and forming a first impurity region of a first conductive type in the second well region.

In accordance with some exemplary embodiments, the second drift region may have an impurity concentration higher than that of the well region, the second well region may have an impurity concentration higher than that of the second drift region, and the first impurity region may have an impurity concentration higher than that of the second well region.

In accordance with some exemplary embodiments, the method may further include forming a gate field plate on the well region and the second drift region.

In accordance with some exemplary embodiments, the gate field plate may be formed by a local oxidation of silicon process.

In accordance with some exemplary embodiments, the forming the source region may have forming a third well region of a second conductive type at a surface portion of the well region and forming a second impurity region of a first conductive type at a surface portion of the third well region.

In accordance with some exemplary embodiments, the forming the source region may further include forming a third impurity region at one side of the second impurity region and forming a fourth impurity region at another side of the second impurity region. The third impurity region may have a first conductive type and an impurity concentration lower than that of the second impurity region, and the fourth impurity region may have a second conductive type and an impurity concentration higher than that of the third well region.

In accordance with some exemplary embodiments, the second, third and fourth impurity regions may be formed in the third well region.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in more detail with reference to the accompanying drawings. The claimed invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the claimed invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the claimed invention. Unless otherwise defined herein, all the terms used herein, which include technical or scientific terms, may have the same meaning that is generally understood by those skilled in the art.

The depicted embodiments are described with reference to schematic diagrams of some embodiments of the claimed invention. Accordingly, changes in the shapes of the diagrams, for example, changes in manufacturing techniques and/or allowable errors, are sufficiently expected. Accordingly, embodiments of the claimed invention are not described as being limited to specific shapes of areas described with diagrams and include deviations in the shapes and also the areas described with drawings are entirely schematic and their shapes do not represent accurate shapes and also do not limit the scope of the claimed invention.

Figure 1:
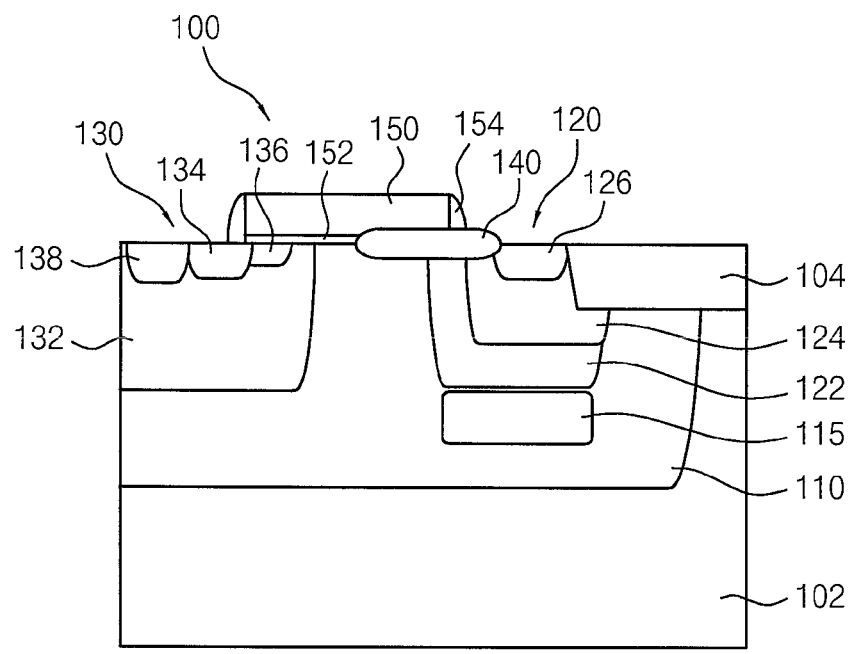
FIG. 1 is a cross-sectional view of illustrating a high voltage semiconductor device in accordance with an exemplary embodiment of the claimed invention.

FIG. 1 is a cross-sectional view of illustrating a high voltage semiconductor device in accordance with an exemplary embodiment of the claimed invention.

As shown in FIG. 1, a high voltage semiconductor device 100 includes a substrate 102, a surface 103 (See FIG. 2), an isolation region 104, a first well region 110, a first drift region 115, a drain region 120, a second drift region 122, a second well region 124, a first impurity region 126, a source region 130, a third well region 132, a second impurity region 134, a third impurity region 136, a fourth impurity region 138, a gate field plate 140, a gate electrode 150, a gate insulating layer pattern 152 and spacers 154.

For example, a first well region 110 may be formed at a surface portion 103 of a substrate 102, and a gate electrode 150 and a gate insulating layer pattern 152 may be formed on the first well region 110. Further, a drain region 120 may be formed at a surface portion 111 (See FIG. 3) of the first well region 110 adjacent to one side of the gate electrode 150, and a source region 130 may be formed at a surface portion 112 (See FIG. 4) of the first well region 110 adjacent to another side of the gate electrode 150.

The first well region 110 may have a first conductive type, and the substrate 102 may have a second conductive type. For example, a p-type substrate may be used as the substrate 102, and an n-type first well region 110 may be formed at the surface portion 103 of the substrate 102. Alternatively, a p-type epitaxial layer may be formed on the substrate 102, and the first well region 110 may be formed at a surface portion of the p-type epitaxial layer.

In accordance with an exemplary embodiment of the claimed invention, a first drift region 115 of a second conductive type may be formed under the drain region 120. For example, the first drift region 115 may be formed in the first well region 110, and the drain region 120 may be formed on the first drift region 115, as shown in FIG. 1. The first drift region 115 may be used to expand a depletion region, and thus the breakdown voltage of the high voltage semiconductor device 100 may be sufficiently improved.

The drain region 120 may include a second drift region 122 formed on the first drift region 115, a second well region 124 formed on the second drift region 122, and a first impurity region 126 formed on the second well region 124. The second drift region 122, the second well region 124, and the first impurity region 126 may have a first conductive type. For example, an n-type second drift region 122 may be formed on the p-type first drift region 115, and an n-type second well region 124 may be formed on the n-type second drift region 122. Further, an n-type first impurity region 126 functioning as a drain electrode may be formed on the n-type second well region 124.

According to an exemplary embodiment of the claimed invention, the second well region 124 may surround the first impurity region 126, and the second drift region 122 may surround the second well region 124, as shown in FIG. 1. Further, the second drift region 122 may have an impurity concentration higher than that of the first well region 110, the second well region 124 may have an impurity concentration higher than that of the second drift region 122, and the first impurity region 126 may have an impurity concentration higher than that of the second well region 124. Thus, the on-resistance of the high voltage semiconductor device 100 may be sufficiently reduced.

Particularly, the p-type first drift region 115 may be disposed under the n-type second drift region 122 or between the n-type second drift region 122 and the first well region 110, and the depletion region may thus be widely expanded in comparison with the conventional art. Further, the breakdown voltage of the high voltage semiconductor device 100 may be sufficiently improved.

The source region 130 may include a second impurity region 134 having a first conductive type and a third well region 132 surrounding the second impurity region 134. The second impurity region 134 may be formed at a surface portion of the first well region 110 adjacent to the gate electrode 150, and the third well region 132 may have a second conductive type. For example, the source region 130 may include a p-type third well region 132 formed at a surface portion of the first well region 110 and an n-type second impurity region 134 formed at a surface portion of the third well region 132. The n-type second impurity region 134 may be used as a source electrode.

Further, the source region 130 may include a third impurity region 136 having a first conductive type and a fourth impurity region 138 having a second conductive type. The third impurity region 136 may be formed at one side of the second impurity region 134 and may have an impurity concentration lower than that of the second impurity region 134. The fourth impurity region 138 may be formed at another side of the second impurity region 134 and may have an impurity concentration higher than that of the third well region 132. Particularly, the second, third and fourth impurity regions 134, 136 and 138 may be formed in the third well region 132, as shown in FIG. 1.

For example, an n-type third impurity region 136 may be formed under the gate electrode 150 to be adjacent to one side of the second impurity region 134, and a p-type fourth impurity region 138 may be formed to be adjacent to another side of the second impurity region 134. The third impurity region 136 may be used to reduce the on-resistance of the high voltage semiconductor device 100, and the fourth impurity region 138 may be used to improve a source contact and to reduce a voltage drop of the high voltage semiconductor device 100.

According to an exemplary embodiment of the claimed invention, the high voltage semiconductor device 100 may include a gate field plate 140 disposed between the gate electrode 150 and the drain region 120. The gate field plate 140 may be used to prevent an electric field from being concentrated on an edge portion of the gate electrode 150.

FIGS. 2 to 7 are cross-sectional views illustrating a method of the high voltage semiconductor device as shown in FIG. 1.

Figure 2:
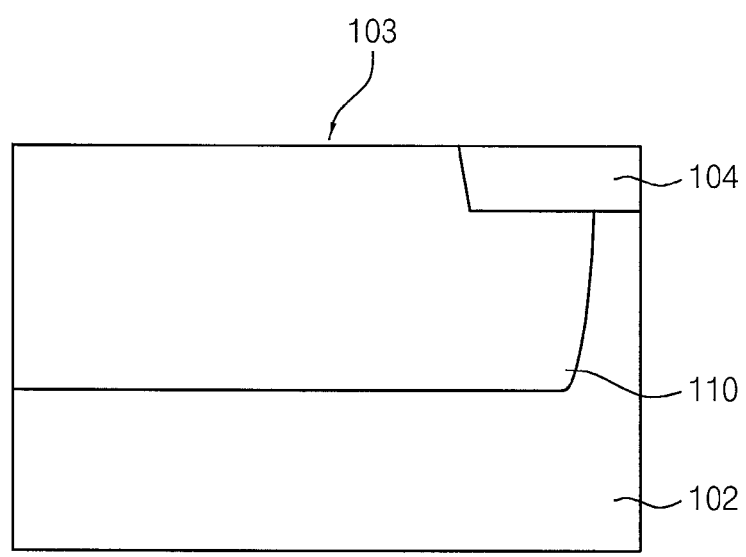
FIGS. 2 to 7 are cross-sectional views illustrating a method of the high voltage semiconductor device as shown in FIG. 1.

Referring to FIG. 2, a first photoresist pattern (not shown) may be formed on a substrate 102, and an ion implantation process using the first photoresist pattern as a mask may then be performed for thereby forming a first well region 110. For example, a p-type substrate or a substrate on which a p-type epitaxial layer is formed may be used as the substrate 102.

The first well region 110 may have a first conductive type. For example, an n-type first well region 110 may be formed by an ion implantation process using an n-type dopant such as arsenic and phosphorus, and then a heat treatment process may be performed so as to activate the n-type first well region 110.

The first photoresist pattern may be removed by an ashing and/or strip process after forming the first well region 110.

Then, device isolation region 104 may be formed by a shallow trench isolation (STI) process.

Figure 3:
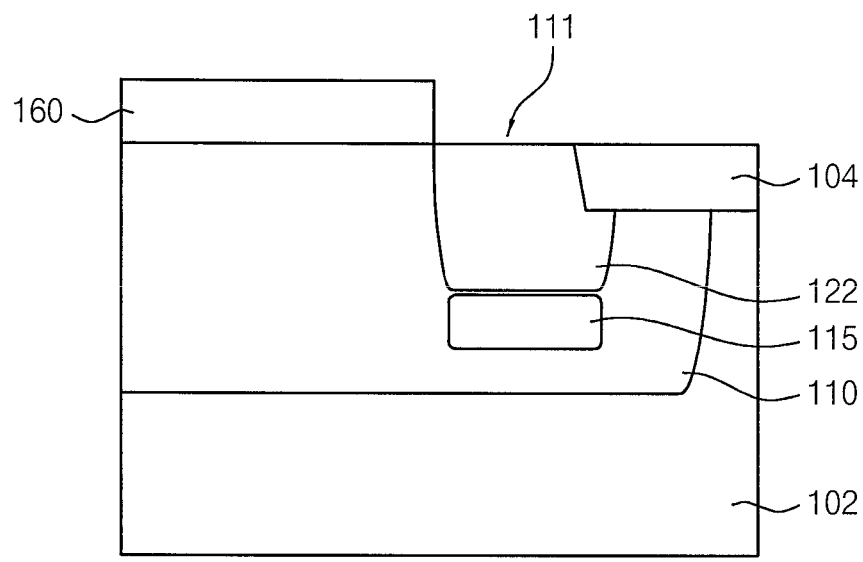

Referring to FIG. 3, a second photoresist pattern 160 may be formed on the substrate 102, and an ion implantation process using the second photoresist pattern 160 as a mask may then be performed to form a first drift region 115 having a second conductive type and a second drift region 122 having a first conductive type.

For example, a p-type first drift region 115 may be formed in the first well region 110, and an n-type second drift region 122 may then be formed on the p-type first drift region 115. The p-type first drift region 115 may be formed by an ion implantation process using a p-type dopant such as boron and indium, and the n-type second drift region 122 may be formed by an ion implantation process using an n-type dopant such as arsenic and phosphorus. Further, a heat treatment process may be performed so as to activate the first and second drift regions 115 and 122.

Figure 4:
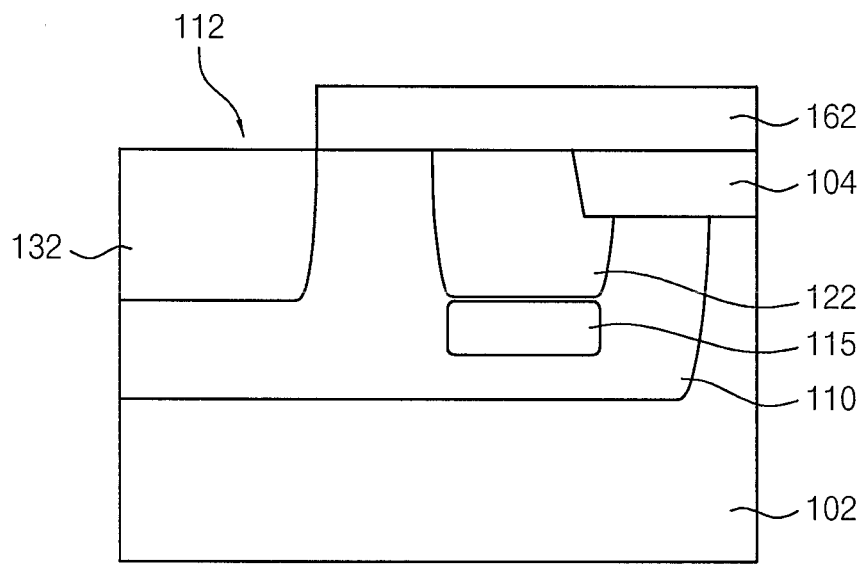

Referring to FIG. 4, a third photoresist pattern 162 may be formed on the substrate 102, and an ion implantation process using the second photoresist pattern 162 as a mask may then be performed to form a third well region 132 having a second conductive type. The third well region 132 may be disposed apart from the second drift region 122, as shown in FIG. 4.

For example, a p-type third well region 132 may be formed by an ion implantation process using a p-type dopant such as boron and indium, and further a heat treatment process may be performed so as to activate the p-type third well region 132.

Figure 5:
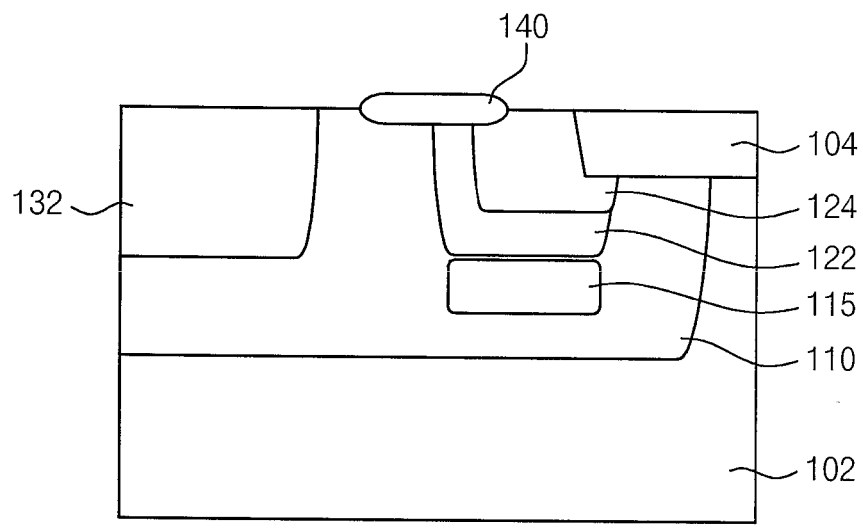

Referring to FIG. 5, a gate field plate 140 may be formed on a portion of the first well region 110 and a portion of the second drift region 122. The gate field plate 140 may be formed by a local oxidation of silicon (LOCOS).

Then, a fourth photoresist pattern (not shown) may be formed on the substrate 102, and an ion implantation process using the fourth photoresist pattern as a mask may then be performed to form a second well region 124 having a first conductive type in the second drift region 122.

An n-type second well region 124 may be formed by an ion implantation process using an n-type dopant such as arsenic and phosphorus, and further a heat treatment process may be performed so as to activate the n-type second well region 124.

Figure 6:
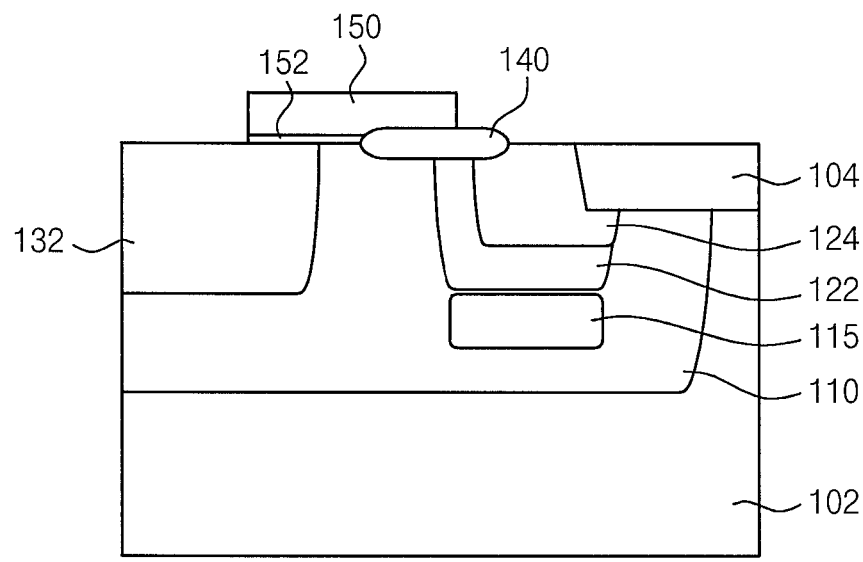

Referring to FIG. 6, a gate electrode 150 and a gate insulating layer pattern 152 may be formed on a portion of the first well region 110, a portion of the third well region 132 and a portion of the gate field plate 140.

For example, a gate insulating layer (not shown) and a gate conductive layer (not shown) may be formed on the substrate 102, and the gate electrode 150 and the gate insulating layer pattern 152 may be formed by patterning the gate conductive layer and the gate insulating layer. For example, a silicon oxide layer may be used as the gate insulating layer, and a doped polysilicon layer may be used as the gate conductive layer.

Figure 7:
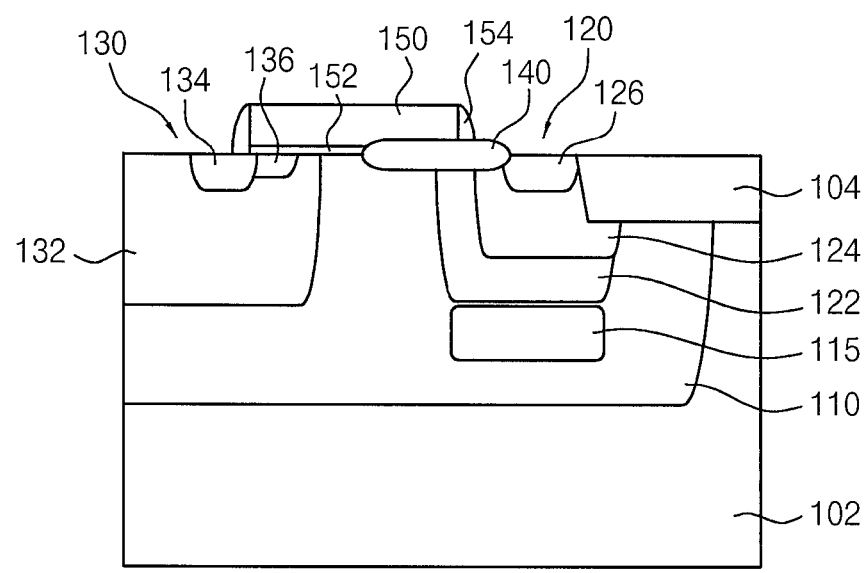

Referring to FIG. 7, spacers 154 may be formed on side surfaces of the gate electrode 150 after forming the gate electrode 150. Further, a first impurity region 126 and a second impurity region 134 may be formed at both sides of the gate electrode 150. The first and second impurity regions 126 and 134 may be formed by an ion implantation process using an n-type dopant such as arsenic and phosphorus, and may be used as a drain electrode and a source electrode, respectively.

A third impurity region 136 of a first conductive type may be formed at one side of the second impurity region 134 before forming the spacers 154.

Further, a fourth impurity region 138 of a second conductive type may be formed at another side of the second impurity region 134 as shown in FIG. 1.

In accordance with the above-mentioned embodiments of the claimed invention, a first drift region 115 of a second conductive type may be formed in a first well region 110 of a first conductive type, and a second drift region 122 of a first conductive type may be formed on the first drift region 115. Thus, the depletion region of a high voltage semiconductor device 100 may be widely expanded, and the breakdown voltage of the high voltage semiconductor device 100 may be sufficiently improved.

Further, a second well region 124 may be formed in the second drift region 122, and a first impurity region 126 functioning as a drain electrode may be formed in the second well region 124. Particularly, the second drift region 122 may have an impurity concentration higher than that of the first well region 110, the second well region 124 may have an impurity concentration higher than that of the second drift region 122, and the first impurity region 126 may have an impurity concentration higher than that of the second well region 124. Thus, the on-resistance of the high voltage semiconductor device 100 may be sufficiently reduced.

Although the high voltage semiconductor device 100 and the method of manufacturing the same have been described with reference to the specific embodiments, they are not limited thereto. Therefore, it will be readily understood by those skilled in the art that various modifications and changes can be made thereto without departing from the spirit and scope of the appended claims.

What is claimed is:

1. A high voltage semiconductor device comprising:
   a well region of a first conductive type formed at a surface portion of a substrate;
   a gate electrode disposed on the well region;
   a source region formed at a first surface portion of the well region adjacent to the gate electrode;
   a drain region formed at a second surface portion of the well region adjacent to the gate electrode; and
   a drift region of a second conductive type disposed in the well region,
   the drain region is disposed vertically above the drift region.

2. The high voltage semiconductor device of claim 1, wherein the substrate comprises the second conductive type.

3. The high voltage semiconductor device of claim 1, wherein the drain region comprises:
   a second drift region of the first conductive type disposed on the drift region;
   a second well region of the first conductive type disposed on the second drift region; and
   a first impurity region of the first conductive type disposed on the second well region.

4. The high voltage semiconductor device of claim 3, wherein the second well region at least partially surrounds the first impurity region, and the second drift region at least partially surrounds the second well region.

5. The high voltage semiconductor device of claim 3, wherein the second drift region has a first impurity concentration higher than that of the well region, the second well region has a second impurity concentration higher than that of the second drift region, and the first impurity region has a third impurity concentration higher than that of the second well region.

6. The high voltage semiconductor device of claim 1, wherein the source region comprises:
   a second impurity region of the first conductive type formed at the surface portion of the well region; and
   a third well region of a second conductive type at least partially surrounding the second impurity region.

7. The high voltage semiconductor device of claim 6, wherein the source region further comprises a third impurity region disposed at one side of the second impurity region, the third impurity region having the first conductive type and an impurity concentration lower than that of the second impurity region.

8. The high voltage semiconductor device of claim 6, wherein the source region further comprises a fourth impurity region disposed at another side of the second impurity region, the fourth impurity region having the second conductive type and an impurity concentration higher than that of the third well region.

9. The high voltage semiconductor device of claim 1, further comprising a gate field plate disposed between the gate electrode and the drain region.

10. A method of manufacturing a high voltage semiconductor device, the method comprising:
    forming a well region of a first conductive type at a surface portion of a substrate;
    forming a drift region of a second conductive type in the well region;
    forming a drain region vertically above the drift region;
    forming a source region spaced apart from the drain region; and
    forming a gate electrode on the well region between the drain region and the source region.

11. The method of claim 10, wherein forming the drain region comprises:
    forming a second drift region of the first conductive type on the drift region;
    forming a second well region of the first conductive type in the second drift region; and
    forming a first impurity region of the first conductive type in the second well region.

12. The method of claim 11, wherein the second drift region has a first impurity concentration higher than that of the well region, the second well region has a second impurity concentration higher than the first impurity concentration, and the first impurity region has a third impurity concentration higher than the second impurity concentration.

13. The method of claim 11, further comprising forming a gate field plate on the well region and the second drift region.

14. The method of claim 13, wherein the gate field plate is formed by a local oxidation of silicon process.

15. The method of claim 10, wherein the forming the source region comprises:
    forming a third well region of the second conductive type at a surface portion of the well region; and
    forming a second impurity region of the first conductive type at a surface portion of the third well region.

16. The method of claim 15, wherein the forming the source region further comprises:
    forming a third impurity region at one side of the second impurity region, the third impurity region having the first conductive type and an impurity concentration lower than that of the second impurity region; and
    forming a fourth impurity region at another side of the second impurity region, the fourth impurity region having the second conductive type and an impurity concentration higher than that of the third well region.

17. The method of claim 16, wherein the second, third and fourth impurity regions are formed in the third well region.

* * * * *